(12) United States Patent
Ichinose et al.

(10) Patent No.: US 7,977,673 B2
(45) Date of Patent: Jul. 12, 2011

(54) SEMICONDUCTOR LAYER WITH A $GA_2O_3$ SYSTEM

(75) Inventors: Noboru Ichinose, Tokyo (JP); Kiyoshi Shimamura, Tokyo (JP); Kazuo Aoki, Tokyo (JP); Encarnacion Antonia Garcia Villora, Tokyo (JP)

(73) Assignee: Koha Co., Ltd., Tokyo (JP)

( * ) Notice: Subject to any disclaimer, the term of this patent is extended or adjusted under 35 U.S.C. 154(b) by 500 days.

(21) Appl. No.: 10/567,369

(22) PCT Filed: Aug. 4, 2004

(86) PCT No.: PCT/JP2004/011531
§ 371 (c)(1),
(2), (4) Date: May 15, 2006

(87) PCT Pub. No.: WO2005/015617
PCT Pub. Date: Feb. 17, 2005

(65) Prior Publication Data
US 2006/0289860 A1     Dec. 28, 2006

(30) Foreign Application Priority Data
Aug. 8, 2003    (JP) .................................. 2003-290862

(51) Int. Cl.
*H01L 29/06* (2006.01)
(52) U.S. Cl. ............ 257/41; 257/E21.113; 257/E21.121
(58) Field of Classification Search .................... 257/43, 257/E21.113, E21.121
See application file for complete search history.

(56) References Cited

U.S. PATENT DOCUMENTS

| | | | | |
|---|---|---|---|---|
| 6,218,207 | B1 * | 4/2001 | Itoh et al. | 438/46 |
| 6,350,666 | B2 * | 2/2002 | Kryliouk | 438/604 |
| 2002/0040722 | A1 | 4/2002 | Okajima | |
| 2002/0058162 | A1 | 5/2002 | Shibata et al. | |
| 2003/0107098 | A1 | 6/2003 | Ota et al. | |
| 2004/0007708 | A1 * | 1/2004 | Ichinose et al. | 257/79 |

FOREIGN PATENT DOCUMENTS

| EP | 1 367 657 A2 | 12/2003 |
|---|---|---|
| JP | 2000-349336 | 12/2000 |
| JP | 2000349336 A * | 12/2000 |
| JP | 2002-029713 | 1/2002 |

(Continued)

OTHER PUBLICATIONS

Yang, Ying-Ge, "Preparation and Structural Properties for GaN Films Grown on Si (1 1 1) by Annealing", Applied Surface Science, vol. 193, 2002, pp. 254 -260.*

(Continued)

*Primary Examiner* — Wael M Fahmy
*Assistant Examiner* — Sarah K Salerno
(74) *Attorney, Agent, or Firm* — McGinn IP Law Group, PLLC

(57) ABSTRACT

To provide a semiconductor layer in which a GaN system epitaxial layer having high crystal quality can be obtained.
The semiconductor layer includes a $\beta$-$Ga_2O_3$ substrate 1 made of a $\beta$-$Ga_2O_3$ single crystal, a GaN layer 2 formed by subjecting a surface of the $\beta$-$Ga_2O_3$ substrate 1 to nitriding processing, and a GaN growth layer 3 formed on the GaN layer 2 through epitaxial growth by utilizing an MOCVD method. Since lattice constants of the GaN layer 2 and the GaN growth layer 3 match each other, and the GaN growth layer 3 grows so as to succeed to high crystalline of the GaN layer 2, the GaN growth layer 3 having high crystalline is obtained.

10 Claims, 3 Drawing Sheets

FOREIGN PATENT DOCUMENTS

| | | |
|---|---|---|
| JP | 2002-187800 | 7/2002 |
| JP | 2002-270525 | 9/2002 |
| JP | 2003-046128 | 2/2003 |
| JP | 2003-46128 | 2/2003 |

OTHER PUBLICATIONS

Park et al. "Ammonolysis of Ga2O3 and its application to the sublimation source for the growth of GaN Film" (2004) Journal of Crystal Growth pp. -6.*

Yang et al. "Preparation and structural porperties for FaN films grown on Si (111) by annealing" (2002) Applied Surface Science pp. 254-260.*

European Search Report dated Nov. 16, 2009.

Japanese Office Action dated Jul. 20, 2010 (with partial English translation).

Chinese Office Action dated May 8, 2009 with an English-Language Translation.

* cited by examiner

SEMICONDUCTOR LAYER WITH A GA₂O₃ SYSTEM

The present application is based on Japanese Patent Application (Japanese Patent Application No. 2003-290862), the whole content of which is incorporated herein by reference.

TECHNICAL FIELD

The present invention relates to a semiconductor layer, and more particularly to a semiconductor layer in which a GaN system epitaxial layer having high crystal quality can be obtained.

BACKGROUND ART

FIG. 3 shows a conventional semiconductor layer. This semiconductor layer includes an $Al_2O_3$ substrate 11 made of $Al_2O_3$, an AlN layer 12 which is formed on a surface of the $Al_2O_3$ substrate 11, and a GaN growth layer 13 which is formed on the AlN layer 12 through epitaxial growth by utilizing an MOCVD (Metal Organic Chemical Vapor Deposition) method (refer to JP 52-36117 B for example).

According to this semiconductor layer, the AlN layer 12 is formed between the $Al_2O_3$ substrate 11 and the GaN growth layer 13, whereby mismatch in lattice constants can be reduced to reduce imperfect crystalline.

However, according to the conventional semiconductor layer, the lattice constants of the AlN layer 12 and the GaN growth layer 13 cannot be perfectly made match each other, and thus it is difficult to further enhance crystal quality of the GaN growth layer 13. In addition, when the conventional semiconductor layer is applied to a light emitting element, crystalline of a luminous layer is degraded, and luminous efficiency is reduced.

Therefore, an object of the present invention is to provide a semiconductor layer in which a GaN system epitaxial layer having high crystal quality can be obtained.

DISCLOSURE OF THE INVENTION

In order to attain the above-mentioned object, the present invention provides a semiconductor layer characterized by including a first layer made of a $Ga_2O_3$ system semiconductor, and a second layer obtained by replacing a part or all of oxygen atoms of the first layer with nitrogen atoms.

According to the semiconductor layer of the present invention, the second layer which is obtained by replacing a part or all of the oxygen atoms of the first layer with the nitrogen atoms is formed on the first layer made of the $Ga_2O_3$ system semiconductor, whereby the second layer made of the GaN system compound semiconductor having high crystalline is obtained without interposing a buffer layer.

BEST MODE FOR CARRYING OUT THE INVENTION

A semiconductor layer according to an embodiment mode of the present invention will be described. This embodiment mode is constituted by a first layer which is made of a $Ga_2O_3$ system semiconductor, a second layer which is made of a GaN system compound semiconductor and which is obtained on the first layer by subjecting a surface of the first layer to nitriding processing or the like to replace a part or all of oxygen atoms of the first layer with nitrogen atoms, and a third layer which is made of a GaN system epitaxial layer on the second layer. Here, "the $Ga_2O_3$ system semiconductor" contains semiconductors such as $Ga_2O_3$, $(In_xGa_{1-x})_2O_3$ where $0 \leq x<1$, $(Al_xGa_{1-x})_2O_3$ where $0 \leq x<1$, and $(In_xAl_yGa_{1-x-y})_2O_3$ where $0 \leq x<1$, $0 \leq y<1$, and $0 \leq x+y<1$, and also contains semiconductors each showing an n-type conductive property or a p-type conductive property through atom replacement or atom defects made for such a semiconductor. In addition, "the GaN system compound semiconductor" and "the GaN system epitaxial layer" contain semiconductors such as GaN, $In_zGa_{1-z}N$ where $0 \leq z<1$, $Al_zGa_{1-z}N$ where $0 \leq z<1$, and $In_zAl_pGa_{1-z-p}N$ where $0 \leq z<1$, $0 \leq p<1$, and $0 \leq z+p<1$, and also contain semiconductors each showing an n-type conductive property or a p-type conductive property through atom replacement or atom defects made for such a semiconductor.

For example, as a first example, the second layer and the third layer can be made of the same compound semiconductor as in the first layer made of $Ga_2O_3$, the second layer made of GaN, and the third layer made of GaN. In addition, as a second example, the second layer and the third layer can also be made of different compound semiconductors, respectively, as in the first layer made of made of $Ga_2O_3$, the second layer made of GaN, and the third layer made of $In_zGa_{1-z}N$ where $0 \leq z<1$. Also, as a third example, the second layer and the third layer can also be made of different compound semiconductors, respectively, and the first layer and the second layer can also be made in accordance with a combination different from that in the first example and the second example as in the first layer made of $(In_xGa_{1-x})_2O_3$ where $0 \leq x<1$, the second layer made of $In_zAl_pGa_{1-z-p}N$ where $0 \leq z<1$, $0 \leq p<1$, and $0 \leq z+p<1$, and the third layer made of $Al_zGa_{1-z}N$ where $0 \leq z<1$.

According to the embodiment mode, since the lattice constants of the second layer and the third layer can be made match each other, or can be made exceedingly approximate to each other, the GaN system epitaxial layer having high crystal quality is obtained.

Embodiment 1

Figure 1:
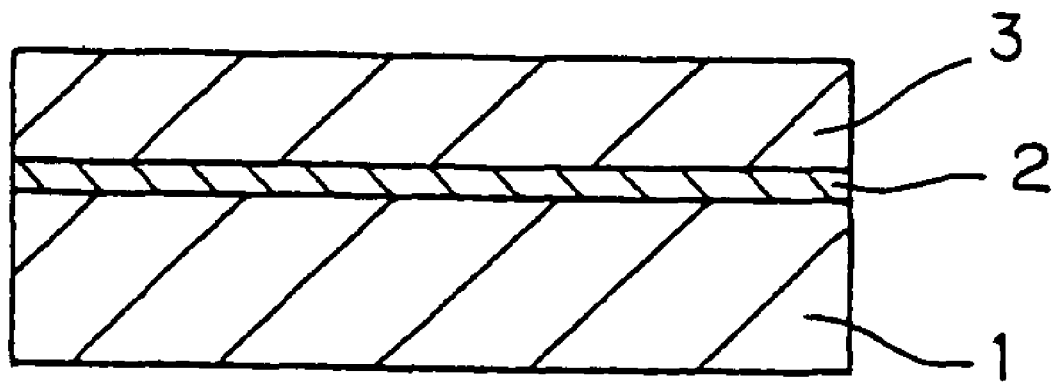
FIG. 1 is a cross sectional view of a semiconductor layer according to Embodiment 1 of the present invention.

FIG. 1 shows a semiconductor layer according to Embodiment 1 of the present invention. The semiconductor layer of Embodiment 1 includes a β-$Ga_2O_3$ substrate 1, as a first layer, which is made of a β-$Ga_2O_3$ single crystal, a GaN layer 2 with about 2 nm thickness, as a second layer, which is formed by subjecting a surface of the β-$Ga_2O_3$ substrate 1 to nitriding processing, and a GaN growth layer 3, as a third layer, which is formed on the GaN layer 2 through epitaxial growth by utilizing an MOCVD method for example. Oxygen atoms of the β-$Ga_2O_3$ substrate 1 are replaced with nitrogen atoms in the nitriding processing, thereby forming the GaN layer 2.

Figure 2:
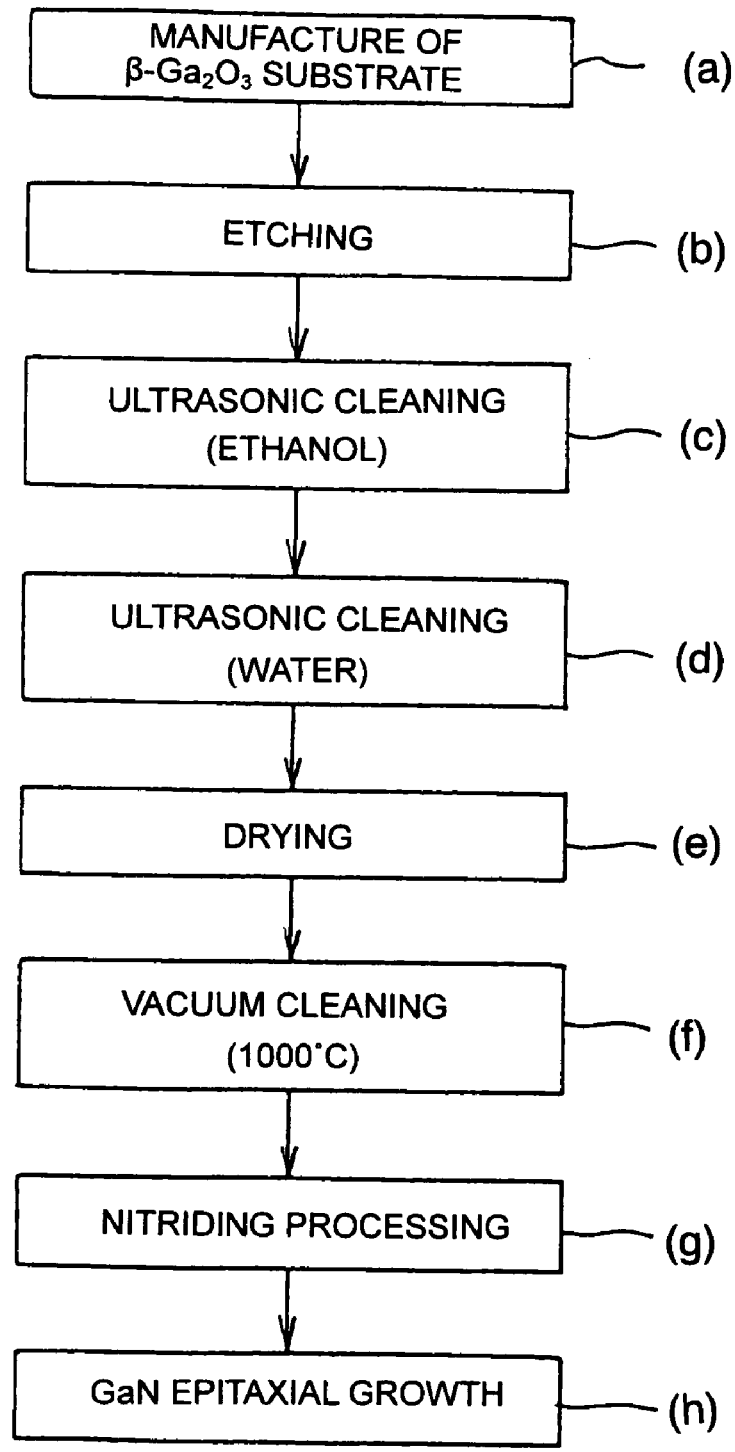
FIG. 2 is a flow chart showing processes for manufacturing the semiconductor layer according to Embodiment 1 of the present invention.
Figure 3:
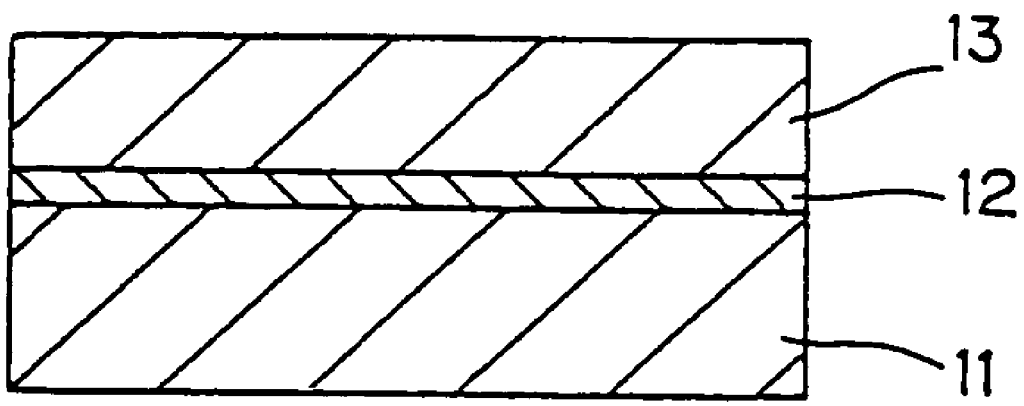
FIG. 3 is a cross sectional view of a conventional semiconductor layer.

FIG. 2 shows processes for manufacturing the semiconductor layer. Firstly, the β-$Ga_2O_3$ substrate 1 is manufactured by utilizing an FZ (floating zone) method (process a). In the first place, a β-$Ga_2O_3$ seed crystal and a β-$Ga_2O_3$ polycrystalline raw material are prepared.

The β-$Ga_2O_3$ seed crystal is obtained by cutting down a. β-$Ga_2O_3$ single crystal through utilization or the like of a cleaved face and has a prismatic shape having a square in cross section, and its axis direction matches a-axis <100> orientation, b-axis <010> orientation, or c-axis <001> orientation.

For example, powders of $Ga_2O_3$ with a purity of 4N are filled in a rubber tube, subjected to cold compression at 500 MPa, and sintered at 1500° C. for 10 hours, thereby obtaining the $\beta$-$Ga_2O_3$ polycrystalline raw material.

Next, heads of the $\beta$-$Ga_2O_3$ seed crystal and the $\beta$-$Ga_2O_3$ polycrystalline are made contact each other in ambient of mixed gas of nitrogen and oxygen (changing from 100% nitrogen to 100% oxygen) at a total pressure of 1 to 2 atmospheres in a silica tube, contact portions thereof are heated to be molten, and the dissolved matter of the $\beta$-$Ga_2O_3$ polycrystalline is cooled, thereby producing the $\beta$-$Ga_2O_3$ single crystal. When being grown as a crystal in the b-axis <010> orientation, the $\beta$-$Ga_2O_3$ single crystal has strong cleavage in a (100) face, and hence the $\beta$-$Ga_2O_3$ single crystal is cut along a face vertical to a face parallel to the (100) face, thereby manufacturing the $\beta$-$Ga_2O_3$ substrate 1. Incidentally, when being grown as a crystal in the a-axis <100> orientation or c-axis <001> orientation, the $\beta$-$Ga_2O_3$ single crystal has weak cleavage in the (100) face and a (001) face. Hence, the processability for all the faces becomes excellent, and thus there is no limit to the cut face as described above.

Next, the $\beta$-$Ga_2O_3$ substrate 1 is etched by being boiled in a nitric acid solution at 60° C. (process b). The resulting $\beta$-$Ga_2O_3$ substrate 1 is then immersed in ethanol and subjected to ultrasonic cleaning (process c). Moreover, after being immersed in water and subjected to the ultrasonic cleaning (process d), the $\beta$-$Ga_2O_3$ substrate 1 is dried (process e) and subjected to vacuum cleaning at 1000° C. in a growth chamber of an MOCVD system (process f) to clean a surface of the $\beta$-$Ga_2O_3$ substrate 1.

Next, the $\beta$-$Ga_2O_3$ substrate 1 is subjected to nitriding processing (process g). That is to say, the $\beta$-$Ga_2O_3$ substrate 1 is heated for a predetermined period of time in a predetermined ambient atmosphere in the growth chamber of the MOCVD system. The ambient atmosphere (including the atmosphere), the heating temperature, and the heating period of time are suitably selected, whereby the desired GaN layer 2 is obtained on the surface of the $\beta$-$Ga_2O_3$ substrate 1. For example, the $\beta$-$Ga_2O_3$ substrate 1 is heated at 1050° C. for 5 minutes in $NH_3$ ambient at 300 torr, whereby the thin GaN layer 2 with about 2 nm thickness is formed on the surface of the $\beta$-$Ga_2O_3$ substrate 1.

Next, GaN is grown by utilizing the MOCVD method to obtain the GaN growth layer 3 (process h). That is to say, when a pressure in the growth chamber of the MOCVD system is reduced to 100 torr, and ammonia gas and trimethylgallium (TMG) are supplied as an N supply raw material and a Ga supply raw material to the growth chamber, respectively, the GaN growth layer 3 with about 100 nm thickness for example grows on the GaN layer 2. The thickness of the GaN growth layer can be controlled by adjusting a concentration of the supply raw materials, the heating temperature, and the like.

In Embodiment 1, when trimethylaluminum (TMA) is supplied together with TMG, an AlGaN layer can be formed as the second layer instead of the GaN layer 2. In addition, when trimethylindium (TMI) is supplied together with TMG, an InGaN layer can be formed as the second layer instead of the GaN layer 2.

According to Embodiment 1, the following effects are obtained.

(1) Since the $\beta$-$Ga_2O_3$ substrate 1 having the high crystalline is obtained, the GaN layer 2 formed thereon is obtained which is low in through dislocation density and which is high in crystalline. Moreover, since the GaN layer 2 and GaN growth layer 3 match in lattice constants each other, and also the GaN growth layer 3 grows so as to succeed to the high crystalline of the GaN layer 2, the GaN growth layer 3 is obtained which is less in through dislocation and which is high in crystalline.

(2) The InGaN layer, for example, is formed between the n-type GaN growth layer and the p-type GaN growth layer, whereby it is possible to manufacture a light emitting element such as a light emitting diode or a semiconductor laser.

(3) Since a luminous layer having high crystalline is obtained when the present invention is applied to the light emitting element, luminous efficiency is enhanced.

(4) Since the $\beta$-$Ga_2O_3$ substrate 1 has the conductive property, when the light emitting element is manufactured, it is possible to adopt a vertical type structure in which electrodes are taken out from a vertical direction of a layer structure and thus it is possible to simplify the layer structure and the manufacture process.

(5) Since the $\beta$-$Ga_2O_3$ substrate 1 has a translucent property, light can also be taken out from the substrate side.

(6) Since the vacuum cleaning (process f), the nitriding processing (process g), and the GaN epitaxial growth (process d) are continuously performed within the growth chamber of the MOCVD system, the semiconductor layer can be efficiently produced.

At that, InGaN, AlGaN or InGaAlN may also be grown instead of the GaN growth layer 3. In the case of InGaN and AlGaN, the lattice constants thereof can be made nearly match those of the GaN layer 2. In the case of InAlGaN, the lattice constants thereof can be made match those of the GaN layer 2.

For example, when an Si-doped GaN layer is formed on the thin film GaN layer 2, a non-doped InGaN layer is formed on the Si-doped GaN layer, and an Mg-doped GaN layer or AlGaN layer is formed on the non-doped InGaN layer, a double hetero type light emitting element is obtained. At this time, when a well layer and a barrier layer which are different in In composition ratio from each other are alternately formed for formation of the non-doped InGaN layer, a laser diode element having an MQW (multi-quantum well layer) is obtained.

On the other hand, when in FIG. 1, the GaN layer 2 and the substrate 1 are removed after the GaN growth layer 3 with a predetermined thickness grows, the GaN substrate is obtained. Likewise, an InGaN layer, an AlGaN layer or an InGaAlN layer is formed instead of the GaN growth layer 3, whereby respective substrates can be obtained.

In addition, while the FZ method has been described as the growing method for the $\beta$-$Ga_2O_3$ substrate 1, any other suitable growth method such as an EFG (Edge-defined Film-fed Growth method) method may also be adopted. Also, while the MOCVD method has been described as the growing method for the GaN system epitaxial layer, any other suitable growth method such as a PLD (Pulsed Laser Deposition) method may also be adopted.

In addition, the semiconductor layer of the present invention is not limited to the light emitting element, and thus can be applied to various kinds of semiconductor components or parts.

INDUSTRIAL APPLICABILITY

According to the semiconductor layer of the present invention, the second layer which is obtained by replacing a part or all of the oxygen atoms of the first layer with the nitrogen atoms is formed on the first layer made of the $\beta$-$Ga_2O_3$ system semiconductor, whereby the second layer which is made of the GaN system compound semiconductor and which has the high crystalline is obtained without interposing a buffer layer. Hence, when the GaN system epitaxial layer is formed on the second layer, the lattice constants of the second layer and the GaN system epitaxial layer can be made match each other, or can be made exceedingly approximate to each other, and thus the GaN system epitaxial layer having the high crystal quality is obtained.

The invention claimed is:

1. A semiconductor layer, comprising:
    a $Ga_2O_3$ system single crystal substrate; and
    a layer comprising a nitride surface of said substrate containing oxygen and nitrogen.

2. A semiconductor layer according to claim 1, wherein the substrate comprises $Ga_2O_3$, $(In_xGa_{1-x})_2O_3$ where $0 \leq x<1$, $(Al_xGa_{1-x})_2O_3$ where $0 \leq x<1$, and $(In_xAl_yGa_{1-x-y})_2O_3$ where $0 \leq x<1$, $0 \leq y<1$, and $0 \leq x+y<1$ as a main constituent.

3. A semiconductor layer according to claim 1, wherein the layer consists of a single crystal $\beta$-$Ga_2O_3$.

4. A semiconductor layer according to claim 3, wherein the single crystal $\beta$-$Ga_2O_3$ has a prismatic shape having a square in cross section, and its axis direction matches a-axis <100> orientation, b-axis <010> orientation, or c-axis <001> orientation.

5. A semiconductor layer according to claim 1, wherein the layer comprises $(In_xGa_{1-x})_2O_3$ where $0 \leq x<1$.

6. A semiconductor layer according to claim 1, wherein the layer comprises $(Al_xGa_{1-x})_2O_3$ where $0 \leq x<1$.

7. A semiconductor layer according to claim 1, wherein the layer comprises $(In_xAl_yGa_{1-x-y})_2O_3$ where $0 \leq x<1$, $0 \leq y<1$, and $0 \leq x+y<1$.

8. A semiconductor layer, comprising:
    a substrate of a $Ga_2O_3$ system single crystal;
    a layer comprising a nitride surface of said substrate containing oxygen and nitrogen; and
    a GaN system epitaxial layer grown on the layer comprising the nitride surface.

9. A semiconductor layer according to claim 8, wherein the layer comprising the nitride surface consists of single crystal $\beta$-$Ga_2O_3$.

10. A semiconductor layer, comprising:
    a $Ga_2O_3$ system single crystal substrate; and
    a layer comprising a nitride surface of said substrate which contains oxygen and nitrogen,
    wherein the layer comprises a GaN system compound semiconductor.

* * * * *